United States Patent
Kim et al.

(10) Patent No.: US 11,543,433 B2
(45) Date of Patent: Jan. 3, 2023

(54) PROBE TEST CARD AND METHOD OF MANUFACTURING THE SAME

(71) Applicant: SK hynix Inc., Icheon-si (KR)

(72) Inventors: Gyung Jin Kim, Icheon-si (KR); Jae Hyoung Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 140 days.

(21) Appl. No.: 16/858,369

(22) Filed: Apr. 24, 2020

(65) Prior Publication Data

US 2021/0190829 A1    Jun. 24, 2021

(30) Foreign Application Priority Data

Dec. 24, 2019   (KR) .......................... 10-2019-0173962

(51) Int. Cl.
| | | |
|---|---|---|
| *G01R 1/073* | (2006.01) | |
| *G01R 1/067* | (2006.01) | |
| *G01R 31/28* | (2006.01) | |

(52) U.S. Cl.
CPC ....... *G01R 1/07342* (2013.01); *G01R 1/0675* (2013.01); *G01R 1/06761* (2013.01); *G01R 31/2863* (2013.01); *G01R 31/2886* (2013.01)

(58) Field of Classification Search
CPC ............ G01R 1/07342; G01R 1/06761; G01R 31/2863; G01R 31/2886; G01R 1/0675
See application file for complete search history.

(56) References Cited

U.S. PATENT DOCUMENTS

| 8,146,245 B2 | 4/2012 | Chao et al. | |
|---|---|---|---|
| 2016/0299174 A1* | 10/2016 | Pan | .......................... G01R 3/00 |
| 2018/0156842 A1* | 6/2018 | Kim | ................... G01R 1/07342 |

FOREIGN PATENT DOCUMENTS

| CN | 108344887 A | * | 7/2018 | ......... G01R 1/06727 |
|---|---|---|---|---|
| JP | 3962264 B2 | * | 8/2007 | |
| KR | 20100065576 A | * | 6/2010 | |
| KR | 1020140101528 A | | 8/2014 | |

* cited by examiner

*Primary Examiner* — Lee E Rodak

(74) *Attorney, Agent, or Firm* — William Park & Associates Ltd.

(57) ABSTRACT

A probe test card includes a substrate, a plurality of test needles, and a fixing layer. The substrate includes a trench formed at a surface of the substrate. Each of the test needles includes a first end positioned in the trench and a second end, opposite to the first end, protruding from the trench. The fixing layer is formed in the trench to fix the test needles to the trench. The fixing layer includes a resin layer having a ceramic powder.

17 Claims, 6 Drawing Sheets

PROBE TEST CARD AND METHOD OF MANUFACTURING THE SAME

CROSS-REFERENCE TO RELATED APPLICATION

The present application claims priority under 35 U.S.C. § 119(a) to Korean application number 10-2019-0173962, filed on Dec. 24, 2019, in the Korean Intellectual Property Office, which is incorporated herein by reference in its entirety.

BACKGROUND

1. Technical Field

Various embodiments may generally relate to an apparatus for testing a semiconductor device, and may more particularly relate to a probe test card and a method of manufacturing the probe test card.

2. Related Art

Quantum arithmetic technology may be used for solving difficult problems requiring massive calculations. Quantum arithmetic computer technology based on quantum arithmetic technology, which may be superior to using a super computer, has been developed.

High-performance semiconductor devices such as DRAMs provided to a quantum computer require accurate testing.

In order to accurately test high-performance semiconductor devices, a cryogenic environment test apparatus has been proposed. The cryogenic environment test apparatus performs a test process using a probe test card under a cryogenic temperature, which may be achieved by a cooling source such as liquid helium and a high vacuum of about $10^{-7}$ torr.

When the test process is performed using the probe test card under a cryogenic environment, a needle of the probe test card contracts because the needle includes metal. Thus, the contracted needle might not accurately make contact with a probe pad of a wafer to generate a test error.

SUMMARY

In some embodiments of the present disclosure, a probe test card may include a substrate, a plurality of test needles, and a fixing layer. The substrate may include a trench formed at a surface of the substrate. Each of the test needles may include a first end positioned in the trench and a second end, which may be opposite to the first end, protruding from the trench. The fixing layer may be formed in the trench to fix the test needles to the trench. The fixing layer may include a resin layer having a ceramic powder.

In some embodiments, the test needles may be arranged in a pattern substantially the same as a pattern of probe pads of a device under test (DUT).

In some embodiments, the test needles may be arranged spaced apart from each other by a first gap and a second gap wider than the first gap. At least one dummy needle may be arranged between the test needles arranged by the second gap.

In some embodiments of the present disclosure, a probe test card may include a first substrate, a second substrate, a plurality of test needles, and a ceramic powder. The second substrate may be attached to the first substrate. The second substrate may have a first surface and a second surface on which a trench may be formed. Each of the test needles may include a first end fixed to the trench. The first ends of the test needles may be arranged in a pattern substantially the same as a pattern of probe pads of a device under test (DUT). The ceramic powder may be formed in the trench to fix the test needles.

In some embodiments of the present disclosure, a method of manufacturing a probe test card includes providing a substrate having a first surface and a second surface opposite to the first surface and forming a trench on at least one of the first and second surfaces of the substrate, the trench having a size corresponding to a size of a DUT. The method further includes arranging a plurality of test needles in the trench in a pattern substantially the same as a pattern of probe pads of the DUT and forming a fixing layer in the trench to fix the test needles. The fixing layer includes a resin layer including a ceramic powder.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the inventive concept. Although a few embodiments of the present teachings will be shown and described, it will be appreciated by those of ordinary skill in the art that changes may be made in these embodiments without departing from the principles and spirit of the present teachings.

Figure 1:
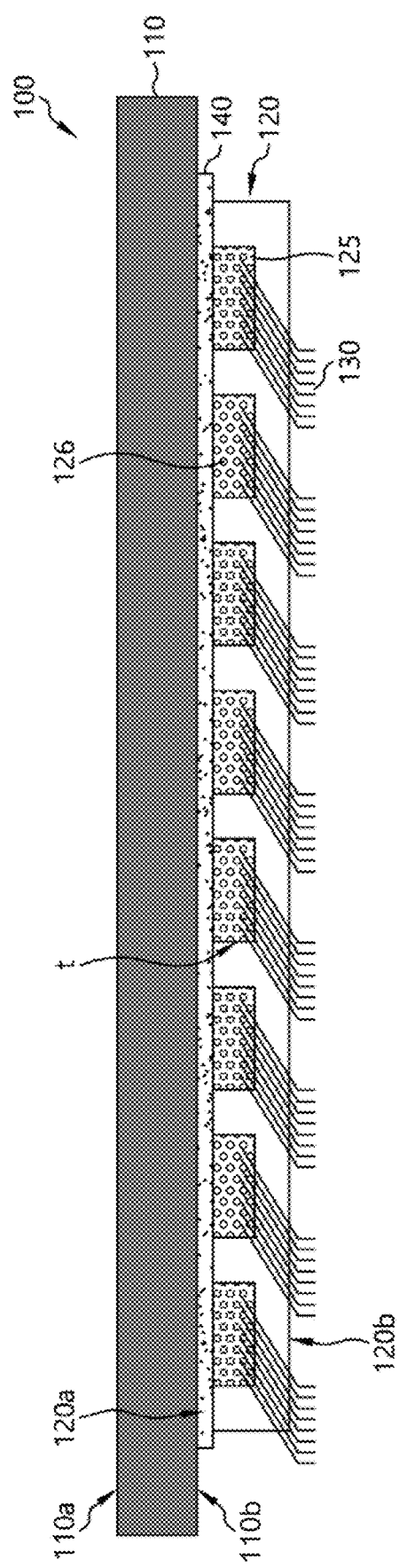
FIG. 1 is a cross-sectional view illustrating a probe test card in accordance with some embodiments.

FIG. 1 is a cross-sectional view illustrating a probe test card in accordance with some embodiments.

Referring to FIG. 1, a probe test card 100 may include a first substrate 110, a second substrate 120, and an adhesive 140.

The first substrate 110 may have a first surface 110a and a second surface 110b opposite to the first surface 110a. The first surface 110a of the first substrate 110 may be connected with a probe tester. The second surface 110b of the first substrate 110 may be attached to the second substrate 120 using the adhesive 140. In some embodiments, the first substrate 110 may include a printed circuit board (PCB). The first substrate 110 may have a circular cross-sectional shape. The first substrate 110 may include circuits configured to test a semiconductor device and a plurality of wirings connected between the circuits.

The second substrate 120 may have a first surface 120a and a second surface 120b opposite to the first surface 120a. The second substrate 120 may include a ceramic layer. The first surface 120a of the second substrate 120 may be attached to the first substrate 110 using the adhesive 140. The second surface 120b of the second substrate 120 may face a device under test (DUT) (not shown).

A plurality of trenches t may be formed at the first surface 120a of the second substrate 120. The trenches t may be located at positions corresponding to the DUT. A fixing layer 125 may be formed in each of the trenches t. The fixing layer 125 may include a material having a property slightly changed in accordance with a temperature. For example, the fixing layer 125 may include a resin in which a ceramic powder 126 may be included. The fixing layer 125 in the trench t may have a surface substantially coplanar with the first surface 120a of the second substrate 120.

A plurality of test needles 130 may protrude from the second surface 120b of the second substrate 120. The test needles 130 may be drawn from the trench t toward an outside of the second surface 120b of the second substrate 120. The test needles 130 may be arranged spaced apart from each other by a uniform gap corresponding to an arrangement of probe pads of the DUT. The test needles 130 may include a material having good conductivity and good thermal resistance, for example, tungsten.

The adhesive 140 may be configured to attach the first substrate 110 to the second substrate 120. For example, the adhesive 140 may attach the second surface 110b of the first substrate 110 to the first surface 120a of the second substrate 120. In some embodiments, the adhesive 140 may include a resin layer.

Figure 2:
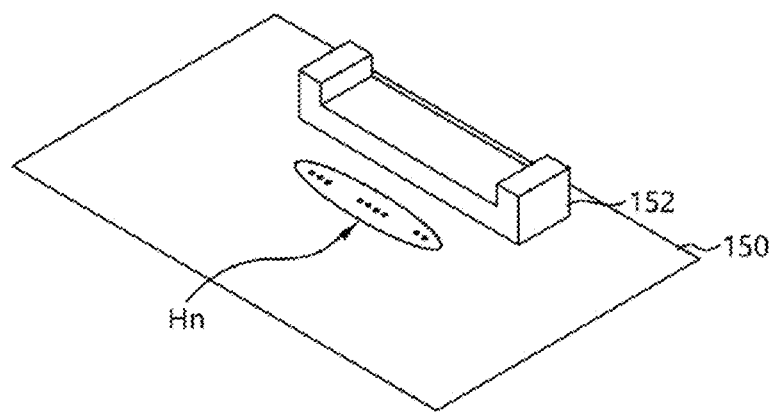
FIGS. 2, 3, and 4 are perspective views illustrating a method of manufacturing the probe test card of FIG. 1.
Figure 3:
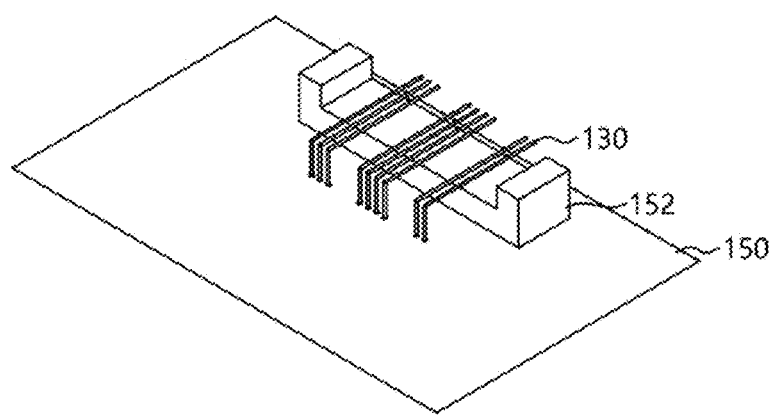
Figure 4:
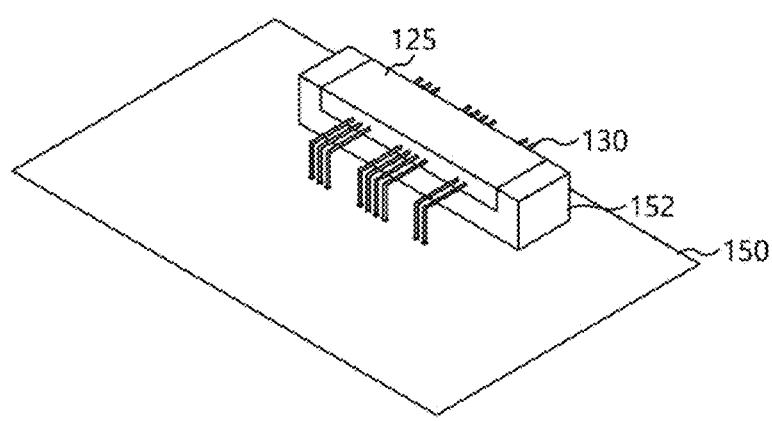

FIGS. 2, 3, and 4 are perspective views illustrating a method of manufacturing the probe test card in FIG. 1. FIGS. 2 to 4 show a portion of the probe test card corresponding to one DUT.

Referring to FIG. 2, a punching film 150 may be prepared. A plurality of needle grooves Hn may be formed at the punching film 150. The needle grooves Hn may have a gap and a shape substantially the same as those of the probe pads of the DUT. A needle fixing member 152 may be formed on a portion of the punching film 150 adjacent to the needle groove Hn. The needle fixing member 152 may have a pattern having a uniform thickness configured to expose the needle groove Hn. For example, the needle fixing member 152 may include a ceramic layer.

A trench t may be formed on the needle fixing member 152. The needle fixing member 152 may have a size configured to receive one trench t or a plurality of the trenches t. Further, the trench t may have a size corresponding to that of one DUT.

Referring to FIG. 3, a plurality of test needles 130 may be positioned in each of the trenches t. A first end of each of the test needles 130 may be positioned in the trench t. A second end of each of the test needles 130 may be inserted into the needle groove Hn of the punching film 150. The test needles 130 in one trench t may have a gap and an arrangement substantially the same as those of the probe pads of the DUT.

Referring to FIG. 4, a fixing layer 125 may be formed in the trench t of the needle fixing member 152. The fixing layer 125 may include a resin layer having a ceramic powder. The resin of the fixing layer 125 may function as to fix the test needles 130 to the trench t. The fixing layer 125 may be cured to firmly fix the test needles 130 to the trench t.

After fixing the test needles 130, the punching film 150 may then be removed. A ceramic layer may be formed on the needle fixing member 152 to fill up spaces between the needle fixing members 152 and to fix outwardly protruded portions of the test needles 130.

Therefore, the first surface 120a of the second substrate 120 may be positioned on an upper surface of the fixing layer 125. Further, the second substrate 120 having the second ends of the test needles 130 protruded from the second surface 120b may be prepared.

The adhesive 140 may be formed on the first surface 120a of the second substrate 120. The second substrate 120 may be attached to the first substrate 110 using the adhesive 140 in FIG. 1.

According to some embodiments, the fixing layer 125 into which the test needles 130 may be inserted may include the ceramic powder 126. Thus, although a temperature change in a cryogenic test process may be generated, the ceramic powder 126 may prevent or limit the resin of the fixing layer 125 from contracting. As a result, the gap between the test needles 130 inserted into the fixing layer 125 is not appreciably changed.

Further, the fixing layer 125 may be formed in regions divided by the trenches t. Thus, although the temperature change may be generated, the expansion and the contraction may be generated within the trench t. As a result, because the expansion and the contraction of the fixing layer 125 may be restricted by the trench t to suppress or reduce the gap change of the test needles 130.

Figure 5:
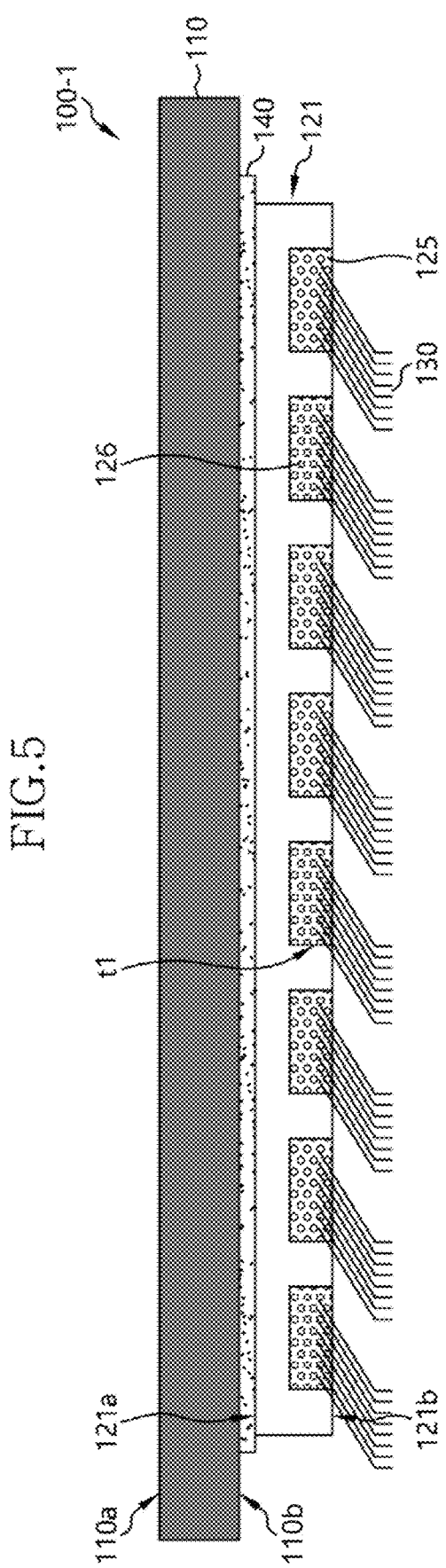
FIG. 5 is a cross-sectional view illustrating a probe test card in accordance with some embodiments.

FIG. 5 is a cross-sectional view illustrating a probe test card in accordance with some embodiments.

The probe test card may include elements substantially the same as those of the probe test card in FIG. 1 except for a trench. Thus, the same reference numerals may refer to the same elements and any further illustrations with respect to the same elements may be omitted herein for brevity.

Referring to FIG. 5, a second substrate 121 may have a first surface 121a and a second surface 121b opposite to the first surface 121a.

A trench t1 may be formed at the second surface 121b of the second substrate 121.

The test needles 130 may be drawn from the trench t1 toward the outside of the second surface 121b of the second substrate 121. The test needles 130 may have an arrangement corresponding to that of the probe pads of the DUT.

The test needles 130 in the trench t1 may be fixed by the fixing layer 125. As indicated above, the fixing layer 125 may include the resin layer having the ceramic powder 126. Thus, when the temperature change may be generated, the position changes of the test needles 130 caused by the contraction of the fixing layer 125 may be prevented or reduced.

Figure 6:
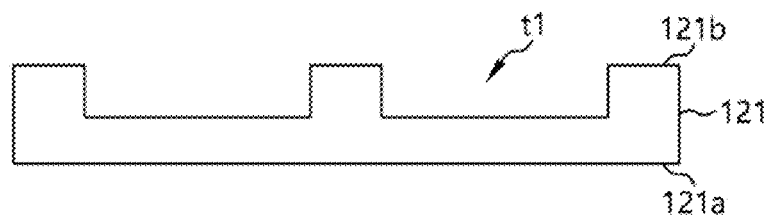
FIGS. 6, 7, and 8 are perspective views illustrating a method of manufacturing the probe test card of FIG. 5.
Figure 7:
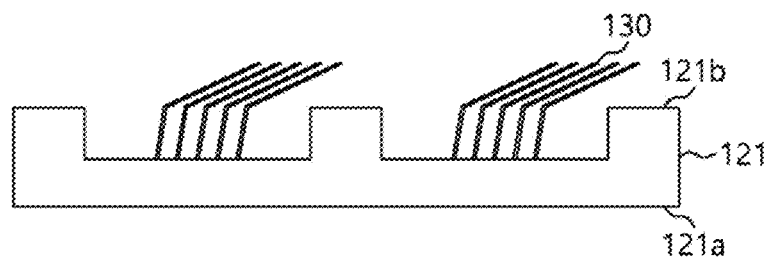
Figure 8:
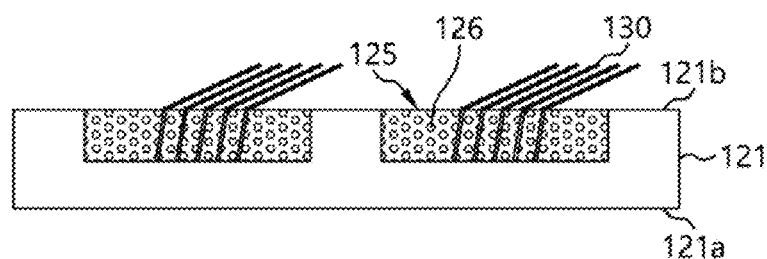

FIGS. 6, 7, and 8 are perspective views illustrating a method of manufacturing the probe test card in FIG. 5.

Referring to FIG. 6, the second substrate 121 may be prepared. The second substrate 121 may include a ceramic substrate. The second substrate 121 may have the first surface 121a and the second surface 121b. The trench t1 may be formed at the second surface 121b of the second substrate 121. The trench t1 may have a size corresponding to that of the DUT. A plurality of needle grooves may be formed at a bottom surface of each of the trenches t1. For example, the needle grooves may have an arrangement corresponding to that of the probe pads of the DUT.

Referring to FIG. 7, the test needles 130 may be placed in each of the trenches t1. The first end of each of the test needles 130 may be inserted into the needle groove on the bottom surface of the trench t1. Thus, the test needles 130 may be arranged in a pattern substantially the same as a pattern of the probe pads of the DUT.

Referring to FIG. 8, the fixing layer 125 may be formed in the trench t1. The fixing layer 125 may include a resin layer having a ceramic powder. Because the fixing layer 125 may be a liquid state, the trench t1 may be fully filled with the fixing layer 125. Further, because the first ends of the test needles 130 in the trench t1 may be fixed by the needle groove, the test needles 130 might not move during forming the fixing layer 125. The fixing layer 125 may be cured to firmly fix the test needles 130 to the trench t while maintaining the arrangement of the test needles 130.

The first surface 121a of the second substrate 121 may be attached to the second surface 110b of the first substrate 110 using the adhesive 140 in FIG. 5.

According to some embodiments, the trenches t1 configured to receive the test needles 130 may face the DUT so that the method of manufacturing the probe test card may be simplified.

Figure 9:
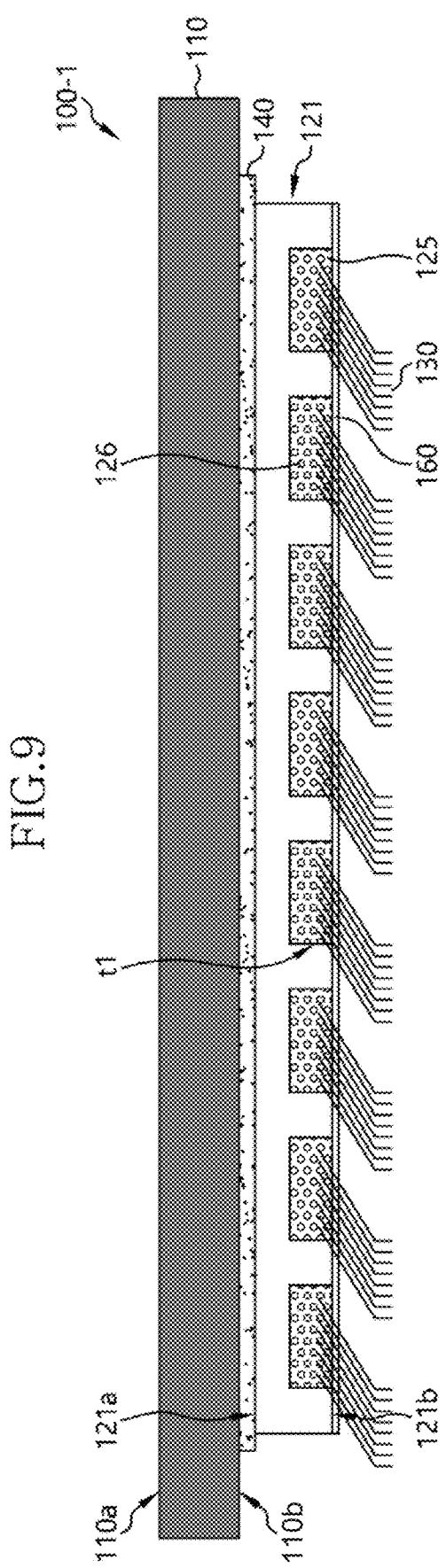
FIG. 9 is a cross-sectional view illustrating a probe test card in accordance with some embodiments.

FIG. 9 is a cross-sectional view illustrating a probe test card in accordance with some embodiments.

The probe test card may include elements substantially the same as those of the probe test card in FIG. 8 except for further including a protecting layer. Thus, the same reference numerals may refer to the same elements and any further illustrations with respect to the same elements may be omitted herein for brevity.

Referring to FIG. 9, the protecting layer 160 may be formed on the second surface 121b of the second substrate 121. The protecting layer 160 may include a ceramic layer. The protecting layer 160 may function as to suppress or decrease shape changes of the fixing layer 125 and the test needles 130 caused by the temperature changes.

Figure 10:
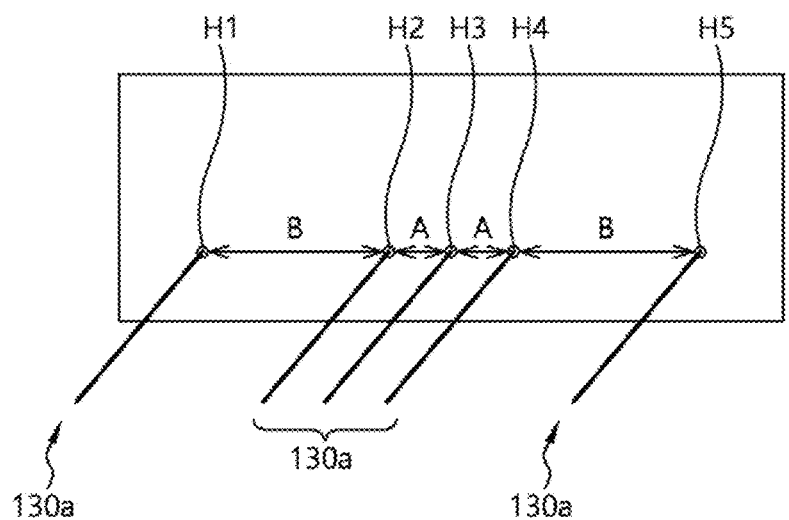
FIG. 10 is a plan view illustrating an arrangement of test needles in a trench in accordance with some embodiments.
Figure 11:
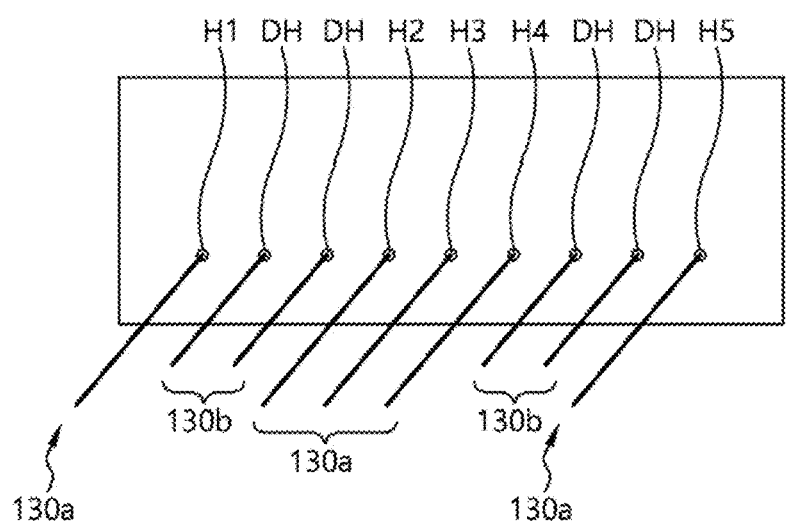
FIG. 11 is a plan view illustrating an arrangement of test needles including dummy test needles in accordance with some embodiments.

FIG. 10 is a plan view illustrating an arrangement of test needles in a trench in accordance with some embodiments, and FIG. 11 is a plan view illustrating an arrangement of test needles including dummy test needles in accordance with some embodiments.

The punching film 150 in FIG. 2 or the test needles 130 fixed to the trench t1 may be arranged in the pattern substantially the same as that of the probe pads of the DUT. Reference numerals H1-H5 in FIG. 10 may indicate test needle grooves configured to fix test needles 130a in the trench t1.

The test needle grooves H1-H5 may be arranged by different gaps. A group of the test needle grooves may have a gap wider than that of another group of the test needle grooves. For example, a gap B between the first test needle groove H1 and the second test needle groove H2 and between the fourth test needle groove H4 and the fifth test needle groove H5 may be wider than a gap A between second to fourth test needle grooves HZ H3, H4.

Leanings of the test needles 130a may be generated between the wide gap between the first and second needle grooves H1 and H2 and between the fourth and fifth needle grooves H4 and H5.

In some embodiments, as shown in FIG. 11, a dummy needle groove DH and a dummy needle 130b inserted into the dummy needle groove DH may be formed between the wide gap between the first and second needle grooves H1 and H2 and between the fourth and fifth needle grooves H4 and H5.

The dummy needle 130b may function as to provide the test needles 130a with the uniform gap. Thus, during the cryogenic test, the leanings of the test needles 130a might not be generated due to the dummy needle 130b. That is, the dummy needle 130b may support the test needles 130a to prevent the leanings of the test needles 130a.

In order to prevent a contact between the dummy needle 130b and other probe pads of the DUT, an end of the dummy needle 130b protruded from the trench t1 may be cut. Thus, the dummy needle 130b may have a length shorter than that of the test needles 130a to prevent the contact between the dummy needle 130b and the other probe pads of the DUT so that test error is not generated.

The above described embodiments of the present teachings are intended to illustrate and not to limit the present teachings. Various alternatives and equivalents are possible. The present teachings are not limited by the embodiments described herein. Nor are the present teachings limited to any specific type of semiconductor device. Another additions, subtractions, or modifications are obvious in view of the present disclosure and are intended to fall within the scope of the appended claims.

What is claimed is:

1. A probe test card comprising:
a substrate having a first surface at which a trench is formed, and a second surface opposite to the first surface;
a plurality of test needles arranged in the trench, each test needle including a first end and a second end being opposite to the first end;
a fixing layer formed in the trench to fix the plurality of test needles in the trench; and
a protecting layer formed on an upper surface of the fixing layer in the trench where the test needles are arranged, wherein the protecting layer extends beyond the trench over the first surface of the substrate,
wherein the fixing layer comprises a ceramic powder, and
wherein the first end of the test needle is non-removably fixed in the trench by the fixing layer and the second end of the test needle protrudes from the trench of the substrate to test a device under test (DUT).

2. The probe test card of claim 1, further comprising an additional substrate attached by an adhesive to the second surface of the substrate.

3. The probe test card of claim 1, wherein the protecting layer comprises a ceramic layer.

4. The probe test card of claim 1, wherein the trench has a size corresponding to a size of the DUT.

5. The probe test card of claim 4, wherein the plurality of test needles are arranged in a pattern substantially the same as a pattern of probe pads of the DUT.

6. The probe test card of claim 5, wherein the plurality of test needles are arranged to have a first gap and a second gap wider than the first gap, and at least one dummy needle is arranged between the test needles arranged to have the second gap.

7. The probe test card of claim 6, wherein the at least one dummy needle has a length shorter than a length of the plurality of test needles such that there is no contact between the dummy needle and the DUT.

8. The probe test card of claim 1, wherein the fixing layer further comprises a resin layer including the ceramic powder.

9. A probe test card comprising:
a first substrate;
a second substrate attached to the first substrate, the second substrate having a first surface and a second surface being opposite to the first surface, the second surface including a plurality of trenches;
a plurality of test needles arranged in each of the plurality of trenches, each test needle including a first end and a second end; and
a fixing layer filled in each trench to non-removably fasten the first ends of the test needles in each trench, respectively,
wherein the second ends of the test needles protrude from the fixing layer of the trench to contact probe pads of a device under test (DUT),
wherein the fixing layer includes a material that having a lower coefficient of thermal expansion than the second substrate, and
wherein the second substrate further includes a protecting layer formed on the second surface of the second substrate.

10. The probe test card of claim 9, wherein the first substrate is attached to the first surface of the second substrate by an adhesive.

11. The probe test card of claim 9, wherein the second substrate further includes a plurality of needle grooves formed at a bottom surface of each trench, and
wherein the plurality of test needles are inserted into the plurality of needles grooves.

12. The probe test card of claim 9, wherein the plurality of test needles positioned in one trench are arranged in parallel while including different gaps from each other.

13. The probe test card of claim 12, wherein the plurality of test needles positioned in one trench includes active test needles which are contacted to the probe pads of the DUT and at least one dummy needle which is not contacted to any probe pad of the DUT.

14. The probe test card of claim 13, wherein the at least one dummy needle is arranged between a pair of adjacent active test needles.

15. The probe test card of claim 9, wherein the fixing layer includes a resin layer and a ceramic powder.

16. A method of manufacturing a probe test card, the method comprising:
providing a substrate having a first surface and a second surface opposite to the first surface;
forming a plurality of trenches on at least one of the first and second surfaces of the substrate, each trench having a size corresponding to a size of a device under test (DUT);
arranging a plurality of test needles in the plurality of trenches, respectively;
forming a fixing layer to fill each trench, thereby non-removably fixing one end of the test needles within the trench wherein the one end of the test needles extends to a bottom surface of the trench; and
forming a protecting layer on a surface of the substrate where the plurality of trenches is formed,
wherein the fixing layer comprises a resin layer including a ceramic powder.

17. The method of claim 16, wherein forming the fixing layer in each trench, includes:
forming a liquid resin material with the ceramic powder to fill each trench; and
curing the liquid resin material with the ceramic powder.

* * * * *